United States Patent [19]

Satoh et al.

[11] Patent Number: 5,276,289
[45] Date of Patent: Jan. 4, 1994

[54] ELECTRONIC CIRCUIT DEVICE AND METHOD OF PRODUCING THE SAME

[75] Inventors: Ryohei Satoh, Yokohama; Fumiyuki Kobayashi, Sagamihara; Yutaka Watanabe, Hadano; Tositada Netsu, Hadano; Mitugu Shirai, Hadano; Kenji Takeda, Kamakura; Masahide Harada, Fujisawa; Kiyoshi Matsui, Yokohama; Hideaki Sasaki, Hadano, all of Japan

[73] Assignee: Hitachi, Ltd., Tokyo, Japan

[21] Appl. No.: 674,599

[22] Filed: Mar. 25, 1991

[30] Foreign Application Priority Data

Mar. 30, 1990 [JP] Japan .................. 2-080713

[51] Int. Cl.$^5$ .................................. H05K 1/00
[52] U.S. Cl. ....................... 174/260; 361/783
[58] Field of Search ............... 174/260, 255, 259, 256, 174/252, 52.3, 52.4; 361/404, 414, 416, 405, 396, 386, 400; 357/75, 80, 81, 74; 428/901; 228/180.2, 123; 257/723

[56] References Cited

U.S. PATENT DOCUMENTS

| | | | |
|---|---|---|---|
| 4,561,011 | 12/1985 | Kohara et al. | 357/74 X |
| 4,673,772 | 6/1987 | Satoh et al. | 228/180.2 X |
| 4,970,577 | 11/1990 | Ogihara et al. | 357/80 X |
| 5,045,922 | 9/1991 | Kodama et al. | 357/75 |

FOREIGN PATENT DOCUMENTS

| | | |
|---|---|---|
| 0055378 | 12/1980 | European Pat. Off. . |
| 3730764C1 | 9/1987 | Fed. Rep. of Germany . |
| 1-184995 | 1/1988 | Japan . |

OTHER PUBLICATIONS

Wassink, "Weichloten in der Elektronik", p. 133.
Beeferman, "Soldering Creams for Electronic Surface Mounted Devices", Welding Journal, pp. 37-40.

Primary Examiner—Leo P. Picard
Assistant Examiner—Cheryl R. Figlin
Attorney, Agent, or Firm—Antonelli, Terry Stout & Kraus

[57] ABSTRACT

The present invention provides a multistep electronic circuit device comprising a plurality of parts and elements mechanically or electrically bonded in sequence to each other and to a substrate with a plurality of solders, which comprises as the parts and elements the substrate, input and output pins and LSI chips, and optionally packages and a cooler bonded through multistep bonding, the bondings of the parts and elements including at least one CCB bonding and at least one sealing, the solders each having a lower melting point than the heatproof temperature of the part or element to be bonded with the solder, and one of the solders having a melting point of at least 10° C. lower than that of the other solder used at the bonding step immediately before. The solders used are selected from Au1-0-15wt%Ge alloy (melting point: 356°-450° C.), Pb1-5wt%Sn alloy (melting point: 314°-325° C.), Pb10-13wt%Sn alloy (melting point: 270°-300° C.), Au20wt%Sn alloy (melting point: 280° C.), Sn3-6wt%Sb alloy (melting point: 232°-243° C.), Sn2-8wt%Ag alloy (melting point: 221°-235° C.), Sn35-55wt%Pb alloy (melting point: 183°-200° C.) and Sn45wt%Pb18wt%Bi alloy (melting point: 135°-160° C.).

7 Claims, 6 Drawing Sheets

ELECTRONIC CIRCUIT DEVICE AND METHOD OF PRODUCING THE SAME

BACKGROUND OF THE INVENTION

1. Field of the Invention

The present invention relates to a multistep electronic circuit device comprising electronic circuit elements, wiring substrates and cooling elements, more particularly to an electronic circuit device capable of being easily assembled in spite of the complicated order of assembling the device, easily disassembled for maintenance, and highly reliable for a long period of time.

2. Description of Related Art

It has hitherto been proposed to assemble various electronic circuit devices such as a computer and electronic automatic exchange with various kinds of solders for many purposes of giving high-speed operation and many functions to the devices and miniaturizing the devices. Particularly, typical examples of prior art high-density electronic circuit devices are one which was assembled with up to three solders, as shown in FIG. 2 attached hereto (see Nikkei Electronics, Mar. 26, 1984, p. 161) and one as shown in FIG. 17 attached hereto (see Japanese Patent KOKAI (Laid-Open) No. Sho 60-226142). In FIG. 2, input and output pins 5 are bonded to a substrate 4 with an AuSn system solder. In FIG. 17, input and output pins 5 are bonded to a circuit board 3 with a Ag solder 4, then LSI chips 6 are bonded to the substrate 3 with a solder 7 of Pb5wt%Sn and a sealing cap 1 is bonded to the substrate 3 with a solder 2 of Sn37wt%Pb eutectic alloy. These electronic circuit devices are featured by being made with the maximum three kinds of solders in such a manner that LSI chips are bonded directly to a substrate to realize the high density of the device (referred to as a multi-chip mounting method) or through the basic steps of connecting input and output pins to a substrate, bonding LSI chips to the substrate and air-tight sealing the device with known solders by melting the solders. Solders used for each of the bondings are Ag solders and AuSn solders for the bonding of the pins, a Pb5wt%Sn solder for the bonding of the LSI chips, and a Sn37wt%Pb solder for the sealing.

However, the electronic circuit devices required to be further improved in their performance were hardly realized by prior art structures of device and prior art solders.

For the purposes of improving the performance of the electronic circuit devices, i.e., giving high-speed operation and many functions to the devices, miniaturizing the devices and making the devices highly reliable, fundamentally (1) LSI chips must be integrated in a larger scale and (2) such LSI chips must be mounted in a higher density. That is, more logic circuits and memory circuits are built in one chip and these LSI chips are assembled in a high density, and in addition, the leads between the chips are made as short as possible, thereby improving a transfer speed of signals.

However, the above-mentioned manners are accompanied with the following difficulties: when the LSI chips are integrated in an ultra-large scale with increased amounts of logic circuits and memory circuits, (1) that a great number of signal-input and output terminals and power terminals for driving the LSI chips are required, (2) that high-speed switching requires ultra-high frequency circuits of several hundreds of MHz to several hundreds of GHz, (3) that this high-speed switching of the great number of circuits requires an increased amount of power, so that the generated amount of heat is highly increased, and (4) that formation of the circuits in a micron or submicron order causes the LSI chips to be very sensitive to surface contaminations due to various impurity ions and/or various gases in each of the steps of assembling the LSI chips. The highly reliable, miniaturized and easy-assembled LSI chips are obtained by overcoming the above-mentioned difficulties.

There are also some difficulties in making high-density mounted, finely patterned LSI chips with improved transfer speed of signals on a substrate and with very short leads, and in using a ceramic having a low dielectric constant and an organic thin film circuit.

Prior art techniques cannot overcome all these difficulties and avoid the contamination of the LSI chips. Furthermore, there is also such a problem that the heat generation of the LSI chips prevents the cooling of the device with good efficiency.

SUMMARY OF THE INVENTION

The primary object of the present invention is to provide a multistep electronic circuit device having no such difficulties as mentioned above and capable of being easily assembled in spite of the complicated order of assembling the device, easily disassembled for maintenance, and highly reliable for a long period of time.

Another object of the present invention is to provide a method of producing the electronic circuit device as mentioned above.

A further object of the present invention is to provide a new series of solders for use in the multistep or hierarchy bonding of the electronic circuit device.

In accordance with the present invention, there is provided a multistep electronic circuit device comprising a plurality of parts and elements mechanically or electrically bonded in sequence to each other and to a substrate with a plurality of solders, which comprises as said parts and elements the substrate, input and output pins and LSI chips, and optionally packages and a cooler bonded through multistep bonding, the bondings of said parts and elements including at least one CCB bonding and at least one sealing, said solders each having a lower melting point than the heatproof temperature of the part or element to be bonded with the solder, and one of said solders having a melting point of at least 10° C. lower than that of the other solder used at the bonding step immediately before.

DETAILED DESCRIPTION OF THE PREFERRED EMBODIMENTS

Figure 1:
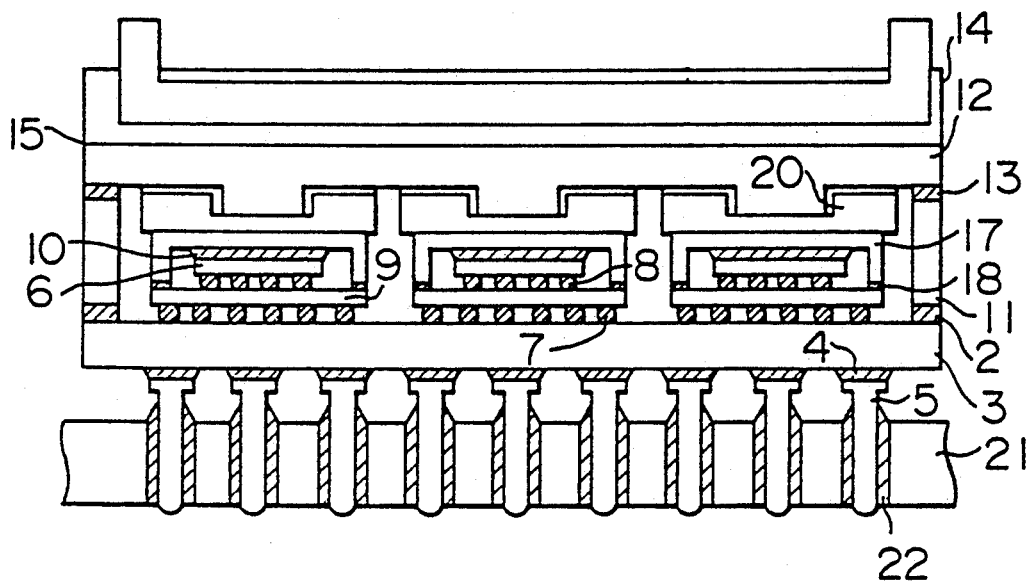
FIG. 1 is a diagrammatical cross-sectional view of an electronic circuit device according to the present invention.
Figure 2:
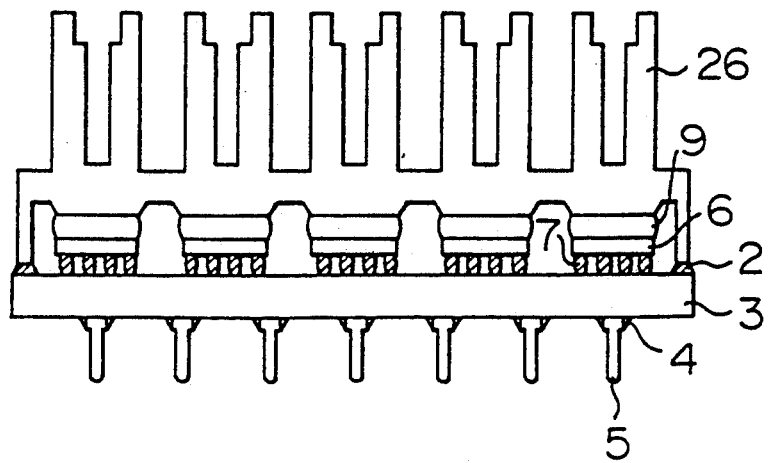
FIG. 2 is a diagrammatical cross-sectional view of a prior art electronic circuit device.

In accordance with the present invention, (1) a known flip-chip type bonding method is adopted to eliminate the problems accompanying the increased number of terminals, in which method weld bondings are made with bumps of a solder. This type method permits terminals to be bonded in all directions over a LSI chip. Therefore, this method is more advantageous in obtaining a chip having an increased number of terminals than the wire-bonding and tape carrier-bonding methods in which the terminals are connected at the periphery of the chip to leads normally used. Furthermore, the flip-chip type method may be applicable to small-sized chips, because there is no need of the terminals being provided at the periphery of chip. Still further, the flip-chip type bonding method advantageously can be carried out on the smallest chip-mounting area of a substrate and is very suitable for high-density multi-chip mounting, because the bonding is made in plane of chip; (2) the ultra-high frequency circuits brings about a problem of noise due to inductance of leads with the wire-bonding method and tape-carrier bonding method requiring the leads. Therefore, the flip-chip type bonding method requiring no leads is more advantageous; (3) the problem of the heat generation of the device is solved by applying a heat-releasable solder to the LSI chips at the backside thereof and cooling the LSI chips with high efficiency; and (4) the LSI chips are air-tightly sealed in a small-sized package with a solder, thereby preventing the deterioration of the LSI chips with impurities and gases. This small-size package is bonded to a substrate by the flip-chip type bonding method. This gives the same advantages as in bonding the LSI chips with the same method.

The entirety of the device is finally air-tightly sealed with a solder to secure the reliability of a high-density mounted device of finely patterned wiring chips. Heat releasing from the sealed device can be made with a solder at the backside of the LSI chips or small-sized package.

Thus, the present inventors have found that a so-called multi-sealing in which not only the LSI chips but also the whole of the device are sealed with a solder, is effective for making the high-speed, high-density chip-mounted electronic circuit device with high reliability, and the heat releasing of the device by applying the solder is also effective for cooling. Either or both of the multi-sealing and the heat releasing with a solder can be used to realize the high-performance electronic circuit device.

Furthermore, the devices of the present invention require a die bonding(s) for securing the heat transfer from the LSI chips to the outside of the devices to increase the reliability.

At least four kinds of solders are required by the multi-sealing or the heat-releasing with solder. That is, these solders are: the first for bonding of input and output pins, the second for bonding of the LSI chips, the third for sealing the entirety of the device and the fourth for sealing the LSI chips or for heat releasing with solder. Thus, the device is assembled with at least four kinds of solders. The elements such as the pins, chips and substrate are bonded by multistep bonding with the solders.

However, conventional one to three solders of a PbSn, SnAg, AuSn and Ag type are not satisfactory to realize the electronic circuit device of the present invention.

The present inventors have found a new series of solders used in the multistep or hierarchy bonding for obtaining the electronic circuit device of the present invention. The new series of solders give the devices so excellent properties that the devices are easily assembled and easily disassembled for maintenance and further the devices are reliable for a long period of time.

In accordance with the present invention, the multistep bonding is stepwise conducted with at least four different solders for the respective steps. In order to conduct the multistep bonding, a difference in melting point between the solders used in one step and another step immediately before is required to be at least about 10° C., taking an account of factors such as a difference in heat capacity between the device elements to be bonded and a working temperature-scattering attributed to by an accuracy of a temperature-controller. Furthermore, the solders are required to have the following properties: they should have so low a tensile strength, i.e., so small a heat shrinking stress in assembling of the device that the substrate and device elements are not broken; they should be resistant to thermal fatigue produced due to a change of operation temperature; they should be resistant to migration short circuit and corrosion in electric field; and they should have a good wettability to the substrate and device elements during the assembling.

Figure 3:
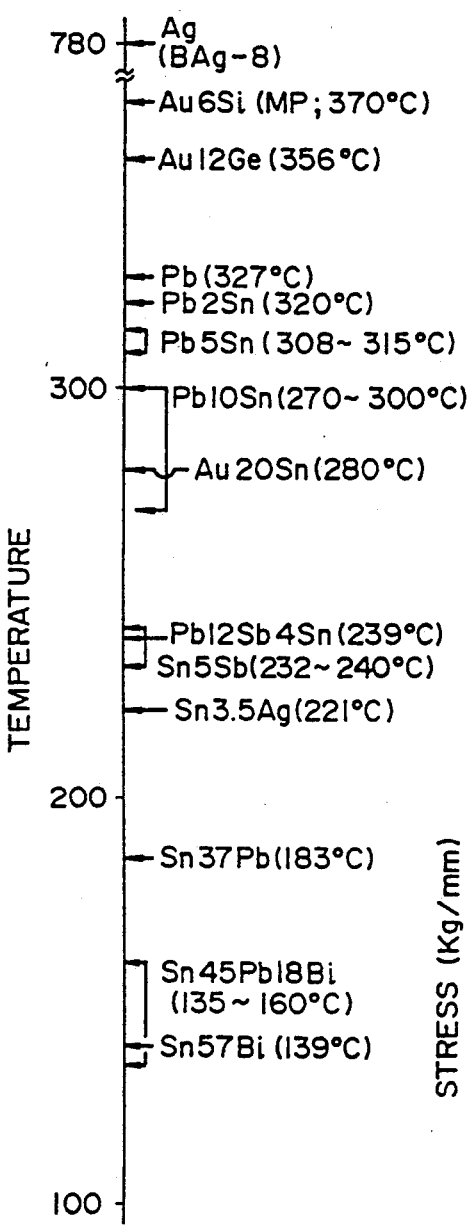
FIG. 3 is a graph showing the melting point of the solders used in the present invention.

FIG. 3 shows many solders arranged in the order of increasing melting temperatures. However, there are only a few solders having the properties all of which are known, such as Sn37wt%Pb eutectic alloy and Pb5wt%Sn alloy. Now, the present inventors have found a series of solders suitable for use in the multistep or hierarchy bonding among the solders.

Combination of solders having a difference in melting point from each other makes it possible to conduct the hierarchy bonding in the order of increasing melting points. Furthermore, the stability of reliability in the assembling of the device is kept for the following reasons: A resin substrate and a ceramic substrate is in general used as an electronic circuit substrate. The ceramic substrate is more fragile than a metal and hence it is easily broken due to thermal strain generated at the interface between the ceramic substrate and the solders during the cooling step after the assembling step. The tensile strength of the ceramic substrate is about 30 kg/mm$^2$ or higher for alumina, about 25 kg/mm$^2$ or higher for mullite and about 15 kg/mm$^2$ or higher for glass (based on the tensile strength test with a strip-shaped piece). Therefore, the tensile strength of the solders at room temperature should be lower than the above-mentioned tensile strength of the ceramic substrate so as not to deform or break the substrate. If the tensile strength of the solders is higher than that of the substrate, the structure of a part to be bonded must be changed or the substrate must be further improved. However, these inconveniently need extra costs as a matter of fact. The series of the solders according to the present invention do not need such extra costs.

Figure 4:
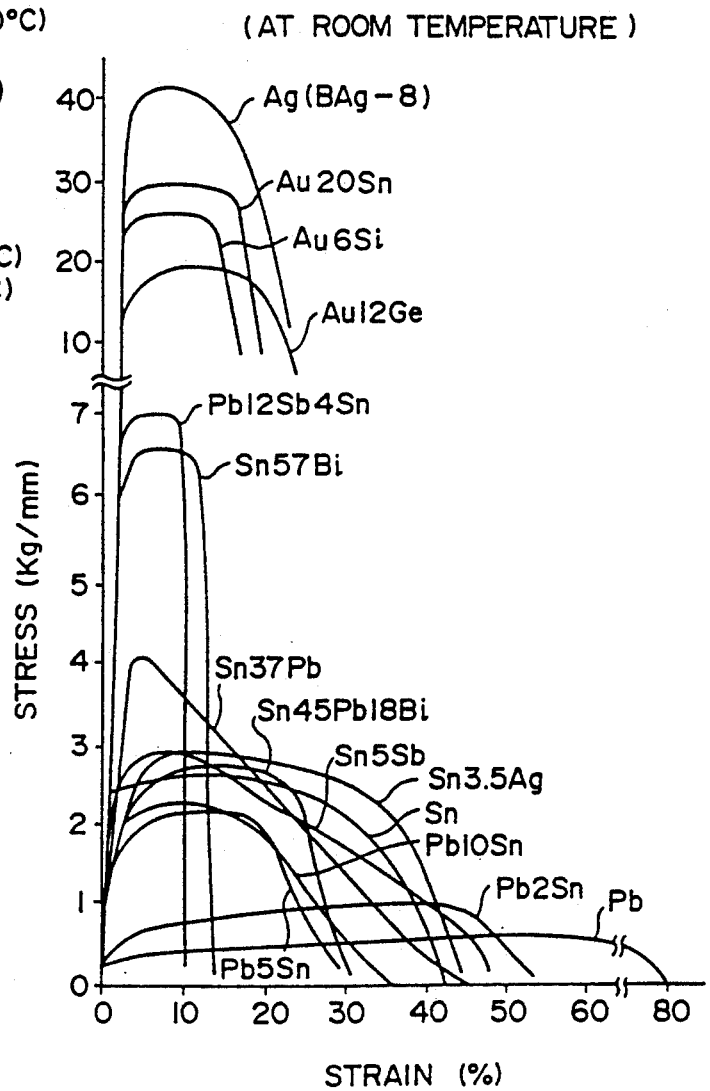
FIG. 4 is a graph showing the tensile stress-strain relationship at room temperature of the solders according to the present invention.

FIG. 4 shows the tensile stress-strain relationship at room temperature of the solders according to the present invention. The solders of the present invention are strong at room temperature and soft at an elevated temperature. That is, the strength at room temperature of the solders should be lower than that of the ceramic to the present invention, which employ four to seven different solders. Table 1 shows the properties of the solders of the present invention together with the properties of other comparative solders.

TABLE 1

| Solder | m.p. (°C.) | Tensile str.*2 (kg/mm² = 9.8 Mpa) | Wettability (Spreading 100% up) | Crack occurring in soldered substrate | | |
|---|---|---|---|---|---|---|
| | | | | Mullite | Glass | Alumina |
| 1 BAg-8 | 780 | 42 | ○ | Yes | Yes | Yes |
| 2 Au6Si eutec. | 370 | 26 | X | No | No | No |
| 3 Au13Ge | 380/356*1 | 20.5 | ○ | " | " | " |
| 4 Au12Ge eutec. | 356 | 20 | ○ | " | " | " |
| 5 Pb | 327 | 0.7 | X | " | " | " |
| 6 Pb2Sn | 320 | 1.0 | ○ | " | " | " |
| 7 Pb5Sn | 315/308*1 | 2.2 | ○ | " | " | " |
| 8 Pb10Sn | 300/270*1 | 2.2 | ○ | " | " | " |
| 9 Au20Sn | 280 | 29 | ○ | " | " | " |
| 10 Sn5Sb | 240/232*1 | 2.9 | ○ | " | " | " |
| 11 Pb12Sb4Sn | 239 | 7.0 | X | " | " | " |
| 12 Sn | 232 | 2.6 | ○ | No | No | No |
| 13 Sn3Ag | 223/221*1 | 2.9 | ○ | " | " | " |
| 14 Sn3.5Ag | 221 | 2.9 | ○ | " | " | " |
| 15 Sn37Pb | 183 | 4.0 | ○ | " | " | " |
| 16 Sn45Pb18Bi | 160/135*1 | 2.7 | Δ | " | " | " |
| 17 Sn57Bi | 139 | 6.6 | Δ | " | " | " |

| | Thermal fatigue*3 Life ratio | Migration short life ratio*4 | | Corrosion*6 (Weight loss: 1%) | Remarks |
|---|---|---|---|---|---|
| | | Water drop | High temp. & humid. | | |
| 1 BAg-8 | — | $10^{-6}$ | ○*5 | X | |
| 2 Au6Si eutec. | — | — | ○ | ○ | |
| 3 Au13Ge | — | — | ○ | ○ | |
| 4 Au12Ge eutec. | — | $10^{-5}$ | ○ | ○ | |
| 5 Pb | — | $10^{-7}$ | ○ | X | |
| 6 Pb2Sn | 1 | — | ○ | ○ | |
| 7 Pb5Sn | 0.8 | — | ○ | ○ | |
| 8 Pb10Sn | 0.6 | — | ○ | ○ | |
| 9 Au20Sn | 0.01 (Substrate broken) | 1 | ○ | ○ | |
| 10 Sn5Sb | 0.6 | — | ○ | ○ | |
| 11 Pb12Sb4Sn | 0.4 | — | ○ | ○ | |
| 12 Sn | 0.8 | $10^{-3}$ | ○ | ○ | Whisker Formed |
| 13 Sn3Ag | 1 | $10^{-3}$ | ○ | ○ | |
| 14 Sn3.5Ag | 1 | $10^{-3}$ | ○ | ○ | |
| 15 Sn37Pb | 0.7 | $10^{-6}$ | ○ | ○ | |
| 16 Sn45Pb18Bi | 0.6 | — | ○ | ○ | |
| 17 Sn57Bi | 0.4 | — | ○ | X | |

*1upper/lower = liquidus temperature/solidus temperature
*2tensile strength at room temperature (about 20° C.)
*3relative evaluation in temperature-cycling test between −50° C. and +150° C. at CCB (Controlled Colapse Bonding) wherein a heat change ($\Delta l = \Delta \alpha \cdot \Delta T \cdot l$) is 5μ.
*4field strength: 10 V/mm in water drop and 10 V/mm in 85% RH at a temperature of 85° C.
*5mark ○ means no migration short circuit after 10,000 hours
*6weight after 5,000 hours in 85% RH at a temperature of 85° C.

substrate. All the solders shown in FIG. 3, except for the Ag solder and Au6wt%Si alloy, have a strength of 20 kg/mm² or less and hence they can safely be used without breaking the alumina and mullite substrates. For the glass substrate the solders, except for Au13wt%Ge, Au12wt%Ge and Au20wt%Sn, have a strength of 15 kg/mm² or less and are applicable.

Thus, in accordance with the present invention, proper combinations of the solders having the properties as required make it possible to assemble highly reliable electronic circuit devices and disassemble the devices for maintenance with ease.

The solders and devices according to the present invention will be clarified from some examples below.

EXAMPLES

The present invention will be illustrated below with reference to the drawings and the tables.

FIGS. 1, 7-16 and 18 are diagrammatical cross-sectional views of the electronic circuit devices according In Table 1, column of "Corrosion", ○ means no occurrence of corrosion and X means occurrence of corrosion. In column of "Wettability", ○ means wetting spreading of more than 100%, X means wetting spreading of less than 100%, and Δ means wetting spreading equal to 100%.

FIG. 1 is a typical example of the devices according to the present invention. In this example, six solders, one having a different melting point from another, were used to assemble an electronic circuit device through the multistep bonding. The assembling procedure is as follows:

Firstly, input and output pins 5 were bonded with Au13wt%Ge solder [melting point: 356° C. (solidus) to 380° C. (liquidus)] to a mullite substrate 3. This bonding was conducted by fusing the solder to connecting terminals metallized with W/Ni/Au on the backside of the substrate 3, in a belt furnace containing a reducing atmosphere of H₂ and N₂ (H₂/N₂ ratio ⅓) at about 400° C.

On the other hand, semiconductor parts were prepared by bonding LSI chips 6 with CCB bondings 8 of Pb2wt%Sn solder (melting point: 320° C.) to small-sized circuit substrates 9 at connecting terminals metallized with the same metals provided thereon, in an inert atmosphere of $N_2$ at about 350° C. Then, the LSI chips 6 were packaged with die bondings 10 and sealings 18 of Pb10wt%Sn solder for discharging of heat. These bonding and sealing were simultaneously carried out by fusion at about 310° C. Then, a plurality of the resulting semiconductor parts were simultaneously bonded at the connecting terminals provided on the backside of the circuit substrate 9, through CCB bondings of Sn3wt%Ag solder (melting point: 221° C.), to the connecting terminals metallized with the same metals provided on the substrate 3, in a belt furnace containing an inert atmosphere of $N_2$ at about 240° C. For sealing the whole of the device, on the other hand, a frame 11 was bonded through frame bonding 13 of Sn3wt%Ag solder to a sealing top board 12, in an atmosphere of He at about 240° C. Thereafter, heat-conducting relay elements 20 were mounted on the respective semiconductor parts, and the sealing of the whole was carried out by fusion of Sn37wt%Pb solder (melting point: 183° C.) in an atmosphere of He at about 200° C. The thus obtained electronic circuit elements comprising a plurality of the chips. The input and output pins 5 were fusion bonded through bondings 22 of Sn45wt%Pb18wt%Bi solder having the lowest melting point to the through-holes of a larger printed circuit board 21 than the electronic circuit elements. This bonding was carried out by melting and jetting the solder on a solder bath and then placing the print circuit board on the bath. Finally, a cooling water path 14 was bonded via a heat conducting grease 15 on the sealing top board 12.

In the procedure mentioned above, attention was paid to the following points: the temperature of heating each of the solders used is chosen so as not to melt the previously applied solder bondings and, therefor, the solder should have a melting point of at least 10° C. lower than that of the solder applied immediately before; the solders should secure to well wet the metallized connecting terminals; and the Au13wt%Ge solder was adopted for bonding the input and output pins 5 for the reasons that the solder produces a stress of about 1 kg/mm$^2$ during cooling after the bonding, which is much lower than the strength of the mullite substrate of 25 kg/mm$^2$, thereby preventing the occurrence of cracks. The same attention were paid to the other solders.

The large-scale electronic circuit devices as mentioned above may often be subjected to maintenance or repaired when the semiconductor parts were broken. In such case, the procedure can easily be conducted in the reverse order to disassemble the device, because there is a difference of at least 10° C. in melting point between the solders applied. If rejected parts or elements are found during the assembling, then good fresh parts or elements can also easily be substituted for the rejected. Thus, in order to make the large-scale electronic circuit devices, it is important to conduct the multistep bonding so as not to melt the solders applied in the previous bonding steps during the post-step. The new combinations of solders according to the present invention well satisfies the requirements for the production of such large-scale electronic circuit devices.

Furthermore, the properties of the solders are also very important to secure the reliability of the electronic circuit devices during the assembling and operation for a long period of time. The properties of the solders used will be described below with respect to Table 1.

The melting point and the tensile strength were previously described with respect to FIGS. 3 and 4. One of the other properties is wettability. The metallizing usually used in the multi-layered wiring on a ceramic substrate is carried out by plating with Ni/Au. Therefore, the wettability of solder to the metallizing of Ni/Au was evaluated by determining the spread area of a ball of the solder having a diameter of 0.3 mm. Solder Nos. 1 to 4 were molten in an atmosphere of $H_2/N_2$. The other solders were molten in an atmosphere of $H_2$. The same flux was used. As a result, Au6wt%Si solder of No. 2, Pb solder of No. 5 and Pb12wt%Sb4wt%Sn solder of No. 11 have a very poor wettability, Au20wt%Sn solder of No. 9, Sn45wt%Pb18wt%Bi solder of No. 16 and Sn57wt%Bi solder of No. 17 have a wetting spreading of about 100%. If the solder has a lower wettability, it is hardly operable. However, solder Nos. 16 and 17 are well wettable to Cu metallizing usually used for resin substrates. The other solders are also good in wetting Cu, Ag-Pd and Pt metallizings on resin substrates. From the foregoing, it has been found that the Au6wt%Si, Pb and Pb12wt%Sb4wt%Sn solders are improper for the multistep bonding.

The crack occurrence during solder welding was examined by brazing each of the solders onto Koval-made lead pins of 0.6 mm in head diameter metallized with the same metal (about 2 mm in diameter) as mentioned above and cooling the solder to room temperature at a cooling rate of about 0.5° C./sec. In this case, there were found no cracks in the solders except for Ag solder. This shows that the bondings do not undergo the heat shrinking stress generated by a great difference in temperature. Use of the Ag solder requires such an extra design that the outer periphery of the metallizing on the substrate side is reinforced to prevent the occurrence of cracks.

The heat fatigue due to repeated change of temperature, the migration short circuit at a voltage applied between terminals and the corrosion under high temperature and high humidity, which are important for the reliability for a long period of time, were examined. Firstly, the heat fatigue was evaluated with CCB bonded samples exhibiting the maximum thermal change of about 5 microns at one cycle per hour between −50° and +150° C. Pb2wt%Sn of solder No. 6, Sn4wt%Ag of solder No. 13 and Sn3.5wt%Ag of solder No. 14 were found to be excellent. Further, Pb5wt%Sn, Sn>Sn37wt%Pb>Pb10wt%Sn, Sn5wt%Sb, Sn45wt%Pb18wt%Bi>Pb12wt%Sb4wt%Sn, and Sn57wt%Bi were found to be superior in this order. Of these solders, Pb12wt%Sb4wt%Sn and Sn57wt%Bi having a relative life of 0.5% appear to pose a problem in practical use. Further, since Au20wt%Sn solder is very hard, the substrate was broken before the fracture of the solder. Therefore, the Au20wt%Sn solder is not applicable to greatly stressed CCB bondings. The same thing may also occur in the solders of Nos. 1 to 4. Thus, use of these solders requires to pay attention to the position at which the bondings are to be applied.

The migration short circuit can be avoided if there are no water droplets about the bondings. Therefore, the bondings should be guarded from sweating to secure the reliability.

In the aspect of the bonding corrosion, all the solders except for Ag, Pb and Sn57wt%Bi solders have a sufficient reliability in practical use.

With Sn solder alone it was found that whiskers were produced at 50° C., which damaged the reliability.

Pb-Sn system solders containing 0.5 to 5 wt% of Ag incorporated therein are somewhat hard, but they have substantially the same properties as those of the Pb-Sn solders and hence can be substituted for the Pb-Sn solders.

From the foregoing, it is found that the combinations of solders suitable for the multistep bonding can be selected from Au12wt%Ge, Au13wt%Ge, Pb2wt%Sn, Pb5wt%Sn, Pb10wt%Sn, Sn5wt%Sb, Sn3wt%Ag, Sn3.5wt%Ag, Sn37wt%Pb and Sn45wt%Pb18wt%Bi. For example, the following combinations are used for six-step bonding:

(1) Au12or13wt%Ge /Pb2wt%Sn /Sn5wt%Sb /Sn3wt%Ag /Sn37wt%Pb /Sn45wt%Pb18wt%Bi;

(2) Au12or13wt%Ge /Pb5wt%Sn /Sn5wt%Sb /Sn3wt%Ag /Sn37wt%Pb /Sn45wt%Pb18wt%Bi; and (3) Au12or13wt%Ge /Pb2wt%Sn /Pb10wt%Sn /Sn3wt%Ag /Sn37wt%Pb /Sn45wt%Pb18wt%Bi It is also possible to substitute a Ag solder for the Au-Ge system solder in the above-mentioned combinations, with the substrate strengthened, brazed and subjected to the treatment for rendering it resistant to corrosion (e.g., Au plating).

Furthermore, the following combinations are used for seven-step bonding:

(1) Au12or13wt%Ge /Pb2wt%Sn /Pb10wt%Sn /Sn5wt%Sb /Sn3or3.5wt%Ag /Sn37wt%Pb /Sn45wt%Pb18wt%Bi

The same solder can be used for bonding the semiconductor parts through CCB bonding 7 and for bonding the sealing frame through bonding 13, if possible in an assembling order, as in FIG. 1:

(2) Au12or13wt%Ge (bondings 4 of input pins) /Pb2wt%Sn (bondings 8 of LSI chips) /Pb10wt%Sn (sealing of LSI chips) /Sn3or3.5wt%Ag (bondings 7 of the semiconductor parts to the substrate) / Sn37wt%Pb (sealing 2 of the whole) /Sn45wt%Pb18wt%Bi (bonding 22 of the printed circuit board).

Figure 16:
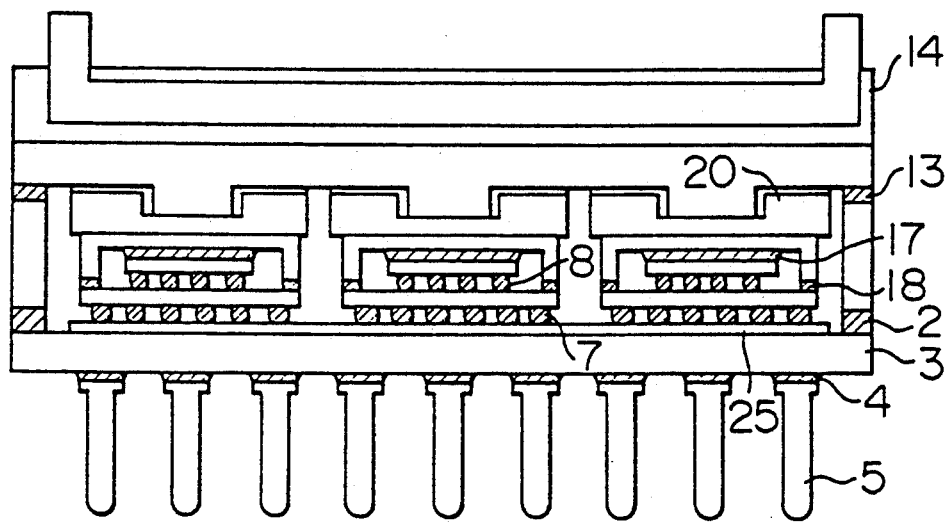

On the other hand, a large-scale integrated substrate having polyimide thin film circuit 25 formed on a multilayered ceramic substrate as shown in FIG. 16 is required to be combined with a solder having a lower melting point, because the thin film is thermally resistant at a temperature of 300° to 350° C. In this case, Au20wt%Sn solder having a lower melting point than that of Au12wt%Ge solder may be used for bonding lead pins. As the other solders may be used the same ones as used above. That is, the following combination may be used:

(1) Pb2wt%Sn (CCB bondings 8 of LSI chips) Pb10wt%Sn (sealing 18 of LSI chips) /Au20wt%Sn (bondings 4 of input and output pins) /Sn3or3.5wt%Ag (CCB bondings 7 of the semiconductor parts) /Sn3or3.5wt%Ag (bonding 13 of the frame) /Sn37wt%Pb (sealing 2 of the whole).

Similarly, four or five solders of these solders can easily be combined to assemble the devices through four- or five-step bonding. Examples using the four or five solders are shown in FIGS. 7 to 11.

Figure 5:
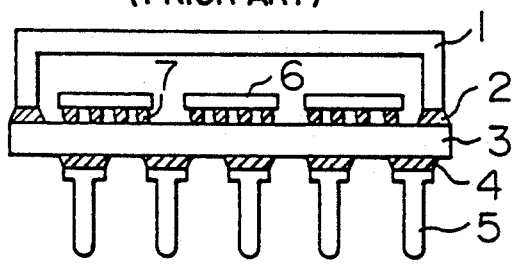
FIGS. 5 and 6 are diagrammatical cross-sectional views of prior art electronic circuit devices.
Figure 17:
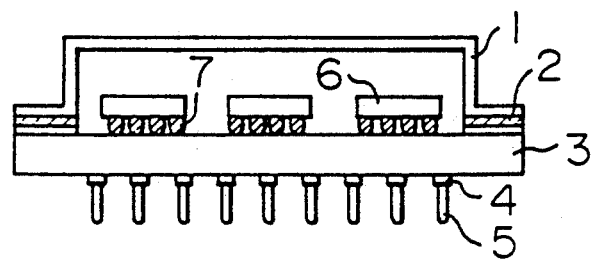
FIG. 17 is a diagrammatical cross-sectional view of another prior art electronic circuit device.

FIGS. 5 and 17 show conventional examples of devices made through three-step bonding with Au12wt%Ge /Pb5wt%Sn /Sn37wt%.

Figure 6:
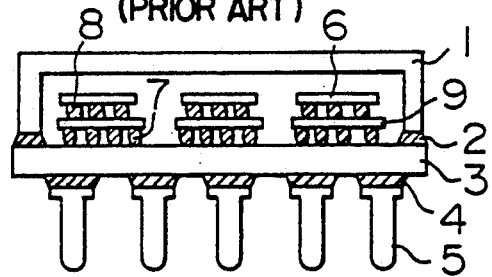

FIG. 6 shows bondings 4 of input and output pins /CCB bondings 8 /CCB bondings 7 /sealing 2 formed in this order with Au13wt%Ge /Pb2wt%Sn or Pb5wt%Sn /Sn3st%Ag /Sn37wt%Pb.

Figure 7:
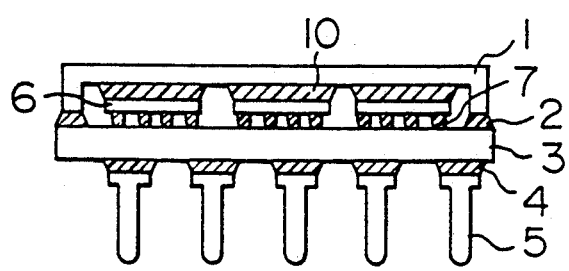
FIGS. 7 to 16 are diagrammatical cross-sectional views of the electronic circuit devices according to the present invention.

FIG. 7 shows bondings 4 of input and output pins /CCB bondings 7 /die bondings 10 /sealing 2 formed in this order with Au13wt%Ge /Pb2wt%Sn /Sn37wt%Pb /Sn37wt%Pb, respectively. The die bonding and the sealing were simultaneously conducted.

Figure 8:
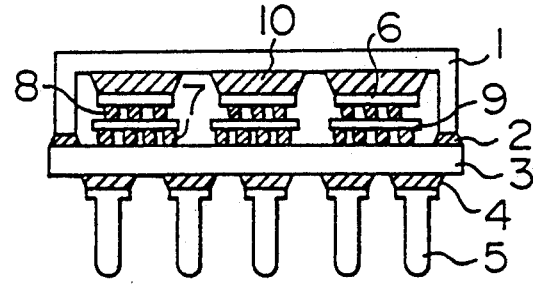

FIG. 8 shows bondings 4 of input and output pins /CCB bondings 8 /CCB bondings 7 /die bondings 10 /sealing 2 formed in this order with Au13wt%Ge /Pb2wt%Sn /Pb10wt%Sn /Sn37wt%Pb /Sn37wt%Pb, respectively.

Figure 9:
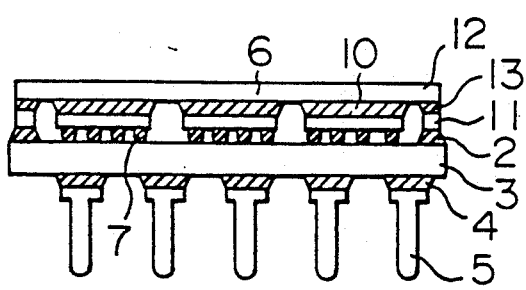

In assembling the device as shown in FIG. 9, Sn3wt%Ag was used for making bondings 13 of frame 11 and sealing top board 12 and the other solders were the same ones as used in FIG. 7.

Figure 10:
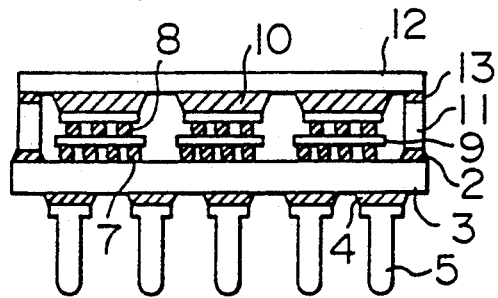

In assembling the device as shown in FIG. 10, Sn3wt%Ag was used for making bondings 13 of frame and the other solders were the same ones as used in FIG. 8.

Figure 11:
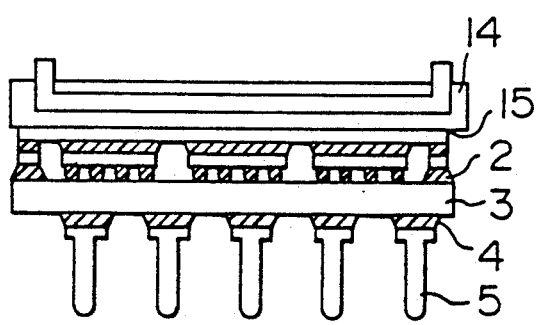

FIG. 11 shows a device having the same structure as in FIG. 9, except that cooling water path 14 was added and adhered to the device with a heat-conducting grease 15.

Other examples concerning devices assembled through bonding at six or more steps are shown in FIGS. 12 to 16.

Figure 12:
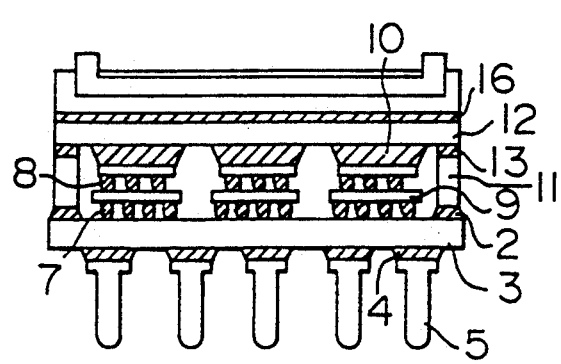

FIG. 12 shows bondings 4 of input and output pins /CCB bondings 8 /CCB bondings 7 /bondings 13 of frame /die bondings 12 /sealing 2 /bonding 16 of cooler formed in this order with Au13wt%Ge /Pb2wt%Sn /Pb10wt%Sn /Sn5wt%Sb /Sn3wt%Ag /Sn37wt%Pb, respectively.

Figure 13:
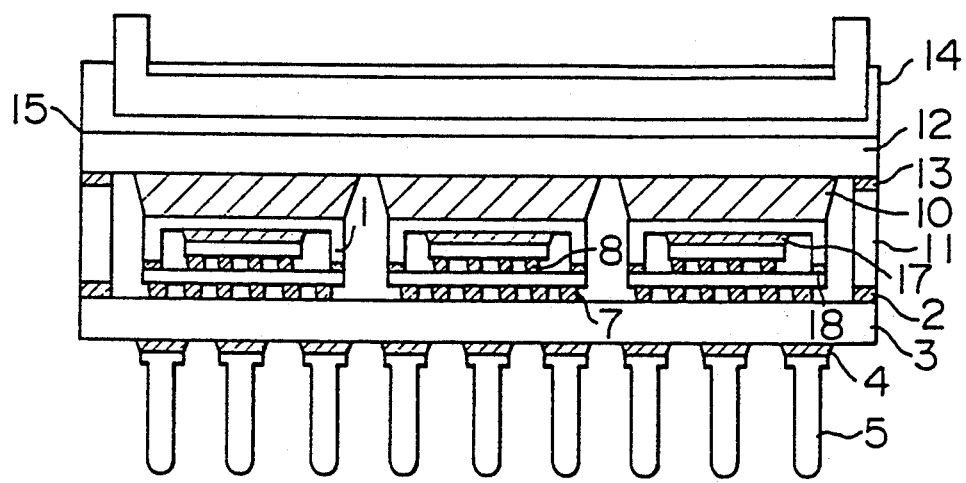

FIG. 13 shows an example of devices using packaged LSI chips, and bondings 4 of input and output pins /CCB bondings 8 /die bondings 17 of packaged LSI chips /sealing 18 of packaged LSI chips /CCB bondings 7 /bondings 13 of frame /die bonding 10 /sealing 2 formed in this order with Au13wt%Ge /Pb2wt%Sn /Pb10wt%Sn /Pb10wt%Sn /Sn5wt%Sb /Sn3wt%Ag /Sn3wt%Ag /Sb37wt%Pb, respectively.

Figure 14:
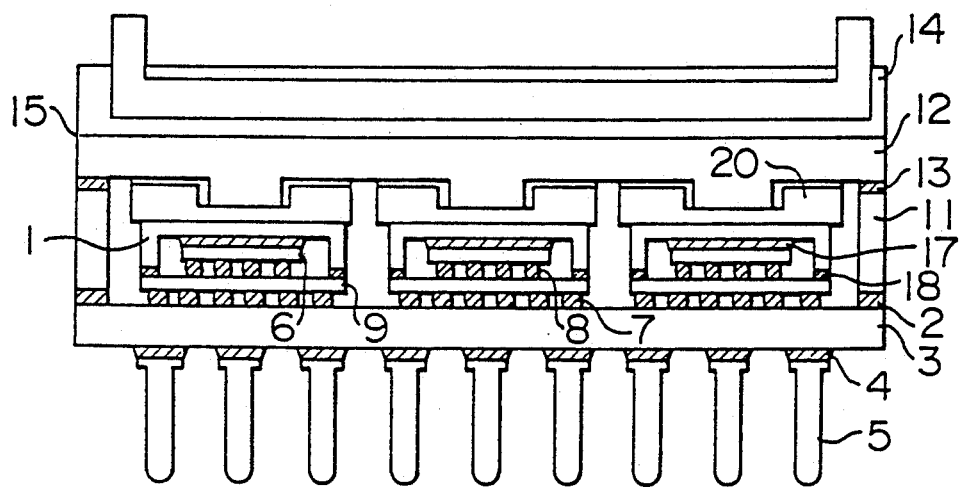
Figure 15:
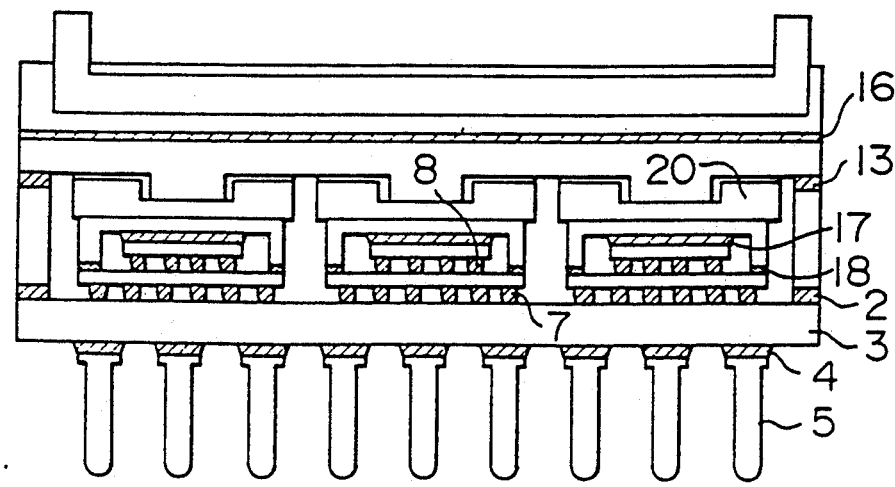

FIGS. 14 and 15 are also examples of devices using packaged LSI chips.

FIG. 14 shows bondings 4 of input and output pins /CCB bondings 8 /die bondings 17 /sealing 18 /CCB bondings 7 /bondings 13 of frame /sealing 2 formed in this order with Au13wt%Ge /Pb2wt%Sn /Pb10wt%Sn /Sn3wt%Ag /Sn3wt%Ag /Sn37wt%Pb, respectively.

FIG. 15 shows bondings 4 of input and output pins /CCB bondings 8 /die bondings 17 /sealing 18 /CCB bondings 7 /bondings 13 of frame /sealing 2 /bonding 16 of cooler formed in this order with Au13wt%Ge /Pb2wt%Sn /Pb10wt%Sn /Pb10wt%Sn /Sn3wt%Ag /Sn3wt%Ag /Sn37wt%Pb /Sn45wt%Pb18wt%Bi, respectively.

Figure 18:
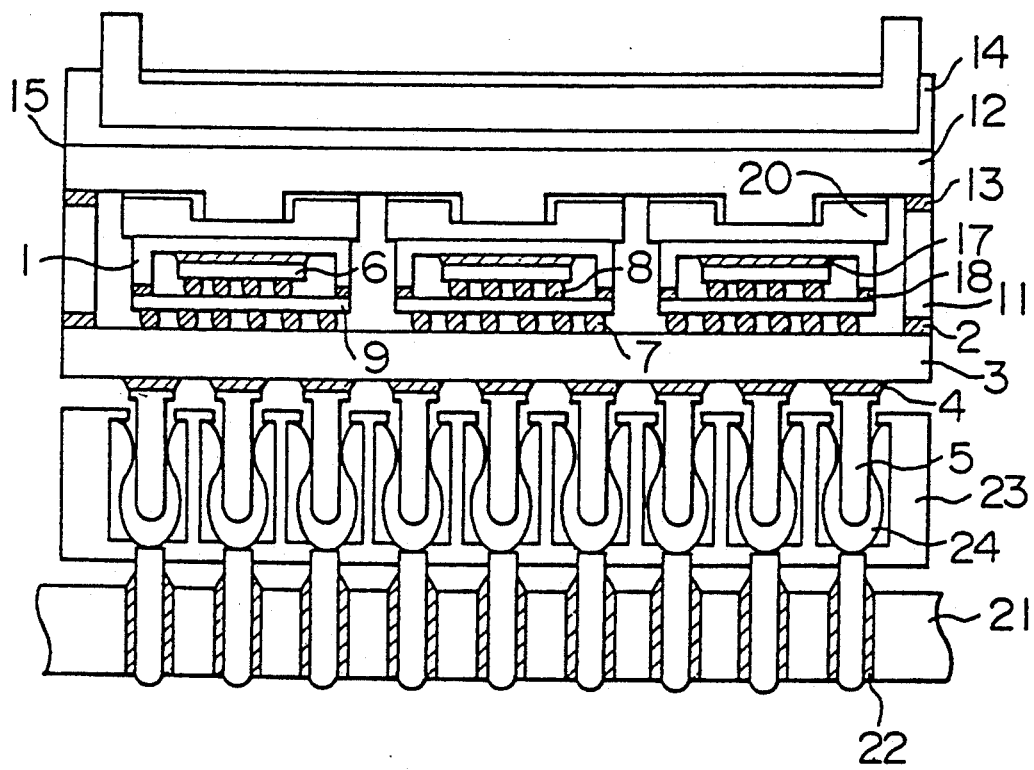
FIG. 18 is a diagrammatical cross-sectional view of another electronic circuit device according to the present invention.

FIG. 18 shows an example of a device having the same structure as shown in FIG. 1, except that a connector contact plate 24 was added. The solders were the same ones as shown in FIG. 17. In this case, addition of a connector 23 makes it possible to independently select a solder 22 and reduce one of the bonding steps. For example, Sn37wt%pb used for sealing 2 may be used as the solder 22.

The thus obtained electronic circuit devices were subjected to the actual operation test by repeating the on-off cycle of power (the junction temperature Tj of LSI chips 6: 85° C.). Operation at 50,000 on-off cycles revealed that all the devices satisfied electric connection and sealing. Observation of the bondings by a scanning electron microscope revealed that there occurred cracks of 1 micron or less, which means that the devices are highly reliable for a long period of time.

On the other hand, the compositional range of each of the solders was examined by using the same evaluating methods as mentioned above and workability (since the range of melting point is broadened, the workability tends to be lowered). The compositional range has been found to properly be Au12-15wt%Ge for AuGe solder, Pb2-3wt%Sn for Pb2wt%Sn, Pb3-7wt%Sn for Pb5wt%Sn, Pb8-13wt%Sn for Pb10wt%Sn, Au18-22wt%Sn for Au20wt%Sn, Sn4-6.5wt%Sb for Sn5wt%Sb, Sn2-8wt%Ag for Sn3.5wt%Ag, Sn35-55wt%Pb for Sn37wt%Pb and Sn40-37wt%Pb15-20wt%Bi for Sn45wt%Pb18wt%Bi. According to the present invention, of these solders some solders are selected so that one of them may have a melting point of at least 10° C. lower than the other solder used immediately before.

What is claimed is:

1. A multistep electronic device which comprises semiconductor chips, first substrates, first sealing packages, second substrates, second sealing packages, and input and output pins, said semiconductor chips being bonded to said first substrates on one side thereof and surrounded by said first sealing packages, said first sealing packages being bonded to the first substrates via a first solder, said first substrates with said semiconductor chips and said first sealing packages provided thereon being bonded on the other side thereof to said second substrates on one side thereof and surrounded by said second sealing packages, said second sealing packages being bonded to the second substrates via a second solder, and said input and output pins being bonded to said second substrates on the other side thereof, wherein a plurality of semiconductor chips, surrounded by first sealing packages, are provided on a single second substrate and surrounded by a single second sealing package.

2. A multistep electronic device according to claim 1, wherein said semiconductor chips and said first sealing packages are bonded through a solder to each other on the surfaces thereof facing each other.

3. A multistep electronic device according to claim 1, wherein said first sealing packages and said second sealing packages are bonded through a solder to each other on the surfaces facing each other.

4. A multistep electronic device according to claim 1, wherein the first solder has a lower tensile strength than that of material of the first substrates, and the second solder has a lower tensile strength than that of material of the second substrates.

5. A multistep electronic device according to claim 1, wherein said semiconductor chips are bonded to the first substrates by a flip-chip bond, and wherein said first substrates are bonded to the second substrates by a flip-chip bond.

6. A multistep electronic device according to claim 1, wherein said semiconductor chips are bonded to the inside of the first sealing packages so as to dissipate heat from the semiconductor chips.

7. A multistep electronic device which comprises semiconductor chips, first substrates, first sealing packages, second substrates, second sealing packages, and input and output pins, said semiconductor chips being bonded to said first substrates on one side thereof and surrounded by said first sealing packages, said first sealing packages being bonded to the first substrates via a first solder, said first substrates with said semiconductor chips and said first sealing packages provided thereon being bonded on the other side thereof to said second substrates on one side thereof and surrounded by said second sealing packages, said second sealing packages being bonded to the second substrates via a second solder, and said input and output pins being bonded to said second substrates on the other side thereof.

* * * * *